United States Patent [19]
Groshong et al.

[11] Patent Number: 5,301,366
[45] Date of Patent: Apr. 5, 1994

[54] HIGH PERFORMANCE FREQUENCY TUNING WITH LOW COST SYNTHESIZER

[75] Inventors: Richard A. Groshong, Cedar Rapids; Thomas R. Hope, Mount Vernon; Robert A. Newgard, Marion, all of Iowa

[73] Assignee: Rockwell International Corporation, Seal Beach, Calif.

[21] Appl. No.: 864,988

[22] Filed: Apr. 7, 1992

[51] Int. Cl.⁵ .......................... H04B 1/40; H04B 1/16
[52] U.S. Cl. .................................. 455/76; 455/153.1; 455/192.3; 455/260
[58] Field of Search ............... 455/183.1, 183.2, 184.1, 455/182.3, 192.3, 76, 260, 314, 118, 77

[56] References Cited

U.S. PATENT DOCUMENTS

| | | | |
|---|---|---|---|
| 4,602,225 | 7/1986 | Miller et al. | 455/76 |
| 5,152,005 | 9/1992 | Bickley | 455/76 |
| 5,170,497 | 12/1992 | Uchikura | 455/183.2 |

OTHER PUBLICATIONS

Knuth, Donald E., "Analysis of Euclid's Algorithm", *The Art of Computer Programming*, vol. 2, 2nd ed. (1981) pp. 339-343.

Primary Examiner—James L. Dwyer
Assistant Examiner—Thanh C. Le
Attorney, Agent, or Firm—Kyle Eppele; M. Lee Murrah; H. Frederick Hamann

[57] ABSTRACT

A communication system and a method for using an approximating frequency synthesizer with frequency correction by digital signal processing (DSP) means to provide a radio transmitter or receiver with rapid high resolution tuning capabilities. A user selects a frequency upon which he wishes to transmit or receive information. An approximating synthesizer is used to provide an RF injection frequency. A radio controller interprets the user selected frequency and determines the closet available approximating synthesizer frequency. The controller commands the approximating synthesizer to the determined available frequency and calculates the difference in the determined available frequency and the user selected frequency. The calculated difference or error is passed on to the DSP for correction during frequency mixing in a single or multiple step process.

11 Claims, 3 Drawing Sheets

HIGH PERFORMANCE FREQUENCY TUNING WITH LOW COST SYNTHESIZER

BACKGROUND OF THE INVENTION

This invention relates to communication systems and more specifically to high resolution frequency tuning for radio transmitters and receivers.

One of the principal components of any communication system is the ability to accurately tune to a desired frequency for signal transmission or receipt. All technological approaches for frequency tuning involve tradeoffs between system complexity and capability.

In designing radio frequency tuners for use in modern day communication applications, engineers have often relied upon the use of Direct Digital Synthesis (DDS) technology for the frequency tuning component. Unfortunately, DDS type systems are typically associated with a high quantity of spurious frequencies that are generated during normal operation. To reduce the self generated spurious frequencies, additional circuitry such as extra phase locked loops (PLLs) are added to the system. These additional PLLs serve as low pass filters reducing the wideband spurious signal content, but at the cost of added design complexity, extra components and increased power consumption.

Alternatively, one might consider use of a Vernier PLL scheme. However, by its auxiliary nature the Vernier PLL generates spurious frequency signals that must be eliminated. These spurious signals are generated by the mixing of two or more loops, such as those in a Vernier synthesizer. As with DDS based radios, significant extra design effort and materials must be spent minimizing the unwanted effects of the self generated spurious frequencies.

In order to avoid the additional circuit complexity and cost associated with the above type communication systems, it is well known to those skilled in the art of such radio design to utilize approximating synthesizer components to achieve desired tuning. An approximating synthesizer has a plurality of predetermined frequencies for transmitting or receiving that are dependent upon design parameters. An approximating synthesizer may be thought of as a device comprised primarily of one or more linked PLLs. The output frequency of the first PLL serves as the reference frequency of the second PLL. Likewise, the output frequency of the second PLL serves as the reference frequency for the third PLL. This relationship between successive PLLs continues through n, where n is the number of PLLs in the approximating synthesizer. Each PLL has a divider component in each of the reference and feedback branches. The output frequency of each PLL is a function of the values programmed into the dividers. As the reference or input frequency of a loop increases, the tune settling time decrease. Therefore, as the number of phase locked loops in an approximating synthesizer increases, the number of programmable integer multiply/divide choices also increases and hence the number of frequency selections also increases.

Unfortunately the use of approximating synthesizer based radios in applications that require high resolution tuning is inhibited since one cannot provide with reasonable circuit parameters small and regular tuning steps as required on an adjustable frequency radio. There exists a need for a relatively simple frequency tuner that can take advantage of approximating synthesizer techniques in a high resolution application.

SUMMARY OF THE INVENTION

The present invention comprises a communication system and a method for using an approximating frequency synthesizer with frequency correction by digital signal processing (DSP) means to provide a radio transmitter or receiver with rapid high resolution tuning capabilities.

A user selects a frequency upon which he wishes to transmit or receive information. An approximating frequency synthesizer is used to provide an RF injection frequency. This type of synthesizer is known to those skilled in the art to be highly stable, exhibit low phase noise and low spurious signal output. The approximating frequency of the present invention may be comprised of a range of non-equal incremental frequencies over a given band or bands.

A radio controller interprets the user selected frequency and determines the closet available approximating synthesizer frequency. The controller commands the approximating synthesizer to the determined available frequency and calculates the difference between the determined available frequency and the user selected frequency. The calculated difference (or error) is passed on to the DSP for correction during frequency mixing.

The DSP receives the intermediate frequency (IF) signal and mixes the signal to a zero hertz (Hz) IF or baseband. The frequency error of the approximating synthesizer calculated by the controller is then mixed out utilizing standard DSP mixing algorithms. The frequency mixing may be accomplished in a single or multiple step process.

It is an object of the present invention to provide a communication system having improved tuning capabilities.

It is a feature of the present invention to accomplish frequency mixing through the use of digital signal processing techniques.

It is an additional feature of the present invention to utilize an approximating synthesizer to accomplish variable IF injection frequency tuning.

It is an advantage of the present invention to provide a communication system which provides swift and efficient frequency tuning capabilities with a relatively low-cost synthesizer.

These and other objects, features and advantages are disclosed and claimed in the specification, figures and claims of the present application.

DETAILED DESCRIPTION OF THE FIGURES

Figure 1:
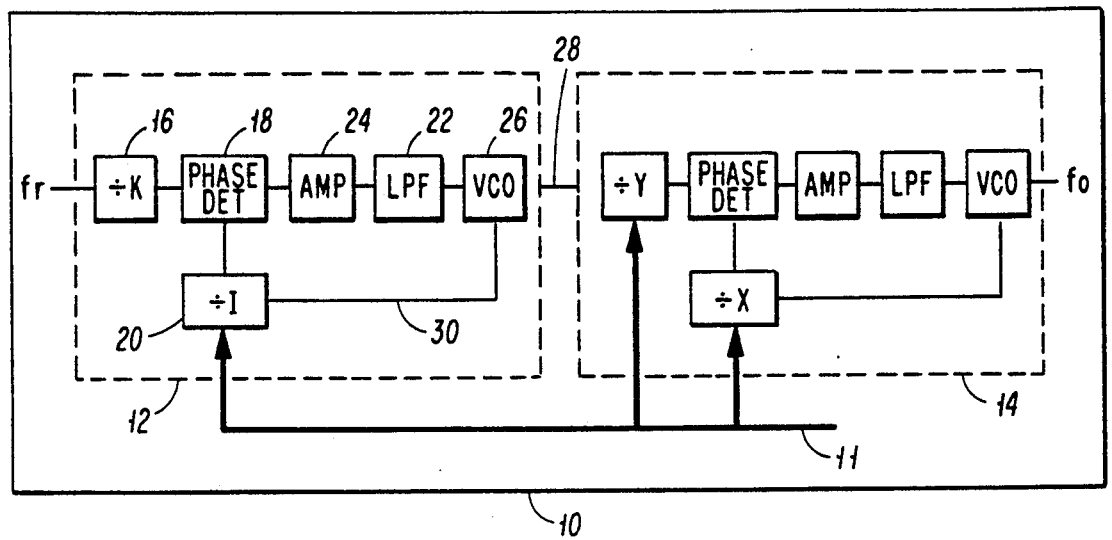
FIG. 1 is a block diagram of an approximating frequency synthesizer, as known in the prior art.

Referring now to the Figures where like items are referenced as such throughout, FIG. 1 shows a block diagram of an approximating frequency synthesizer 10, well known in the prior art and incorporated in the present invention. Arrow 11 represents input from a controller device, not shown, which provides frequency selection information to approximating frequency synthesizer 10. Approximating frequency synthesizer 10 illustrates two phase locked loops 12 and 14. Although approximating frequency synthesizer 10 only depicts two PLLs it is understood that any number of PLLs might be employed in a synthesizer utilizing the teaching of the present invention. PLL 12 and 14 are similarly constructed and for purposes of simplicity only the detailed construction of PLL 12 will be described.

PLL 12 is comprised of a divider 16, a phase detector 18, a divider 20, an integrator 22, a low pass filter 24 and a voltage controlled oscillator (VCO) 26. A reference frequency $f_r$ is input to divider 16 which in turn is coupled to phase detector 18. Phase detector 18 receives an additional input from divider 20 and has its output coupled to integrator 22. Integrator 22 is coupled to low pass filter 24 which in turn is coupled to VCO 26. The VCO generates two output signals represented by arrows 28 and 30 respectively. The signal represented by arrow 30 is coupled to divider 20, while the other VCO signal, arrow 28 may be coupled to the divider component of an additional PLL, as in the case with PLL 14.

When phase locked loop 12 is in a locked condition, the frequency at phase detector input 18 is equal to the reference frequency, $f_r$, divided by the value in the X divider 16. When the reference frequency comes from an accurate and stable frequency source, frequency stability is transferred to the output VCO. The VCO is forced to oscillate at the frequency necessary to keep the inputs to the phase detector from K divider 16 and L divider 20 equal in frequency and phase.

The PLL can produce many discrete frequencies. They are all multiples of the reference frequency $f_r$ divided by K ($f_r/K$) and are selected by choosing a value for the L divider. If the K divider is programmable, then many sets of frequencies are available from PLL 12. For the basic tuning loop of FIG. 1, the frequency tuning increment is $f_r/K$ and the multiple thereof is L, so that the output frequency may be represented mathematically as set forth in equation number 1.

$$f_0 = L/K * f_r \qquad (1)$$

Where
 $f_0$ = Output frequency
 K = Value of K divider
 L = Value of L divider
 $f_r$ = Reference Frequency The close spacing of frequency channels requires small incremental tuning steps which in turn requires a low value of $f_r/K$. This implies a low phase detection frequency. However, a high phase detection frequency allows rapid settling time for the VCO output. Also, as L acts as a multiplier for the reference frequency, it also multiplies the phase noise of the reference, so there is motivation for keeping the value of L low. The conventional solution for high spectral purity with small frequency increments is to employ more than one loop while maintaining the value for the L multipliers below a design value.

In FIG. 1 the two PLLs are linked in cascade fashion. Expanding upon the relationship developed in Equation 1 above the frequency output $f_0$ of approximating frequency synthesizer 10 may be represented by equation 2.

$$f_0 = L/K * X/Y * f_r \qquad (2)$$

Where
 $f_0$ = Output Frequency
 L = Value of L divider
 K = Value of K divider
 X = Value of X divider
 Y = Value of Y divider
 $f_r$ = Reference Frequency By utilizing PLLs having programmable values for dividers K, Y, L, and X an approximating frequency synthesizer having a relatively wide range of frequencies may be constructed. Applicant has designed a two phase locked loop approximating frequency synthesizer using readily available materials, which is capable of producing a set of frequencies no more than 1 KHz apart across the 2-88 MHz band. Thus any frequency within that band can be produced with no more than 1 KHz of error. A factorization algorithm, based on techniques well known to those skilled in the relevant art, computes values for L, X, and Y for all integer frequencies in the band. The factorization algorithm only selects X values below 200 and L values below 2700 to keep the in-band phase noise below the design value.

Figure 2:
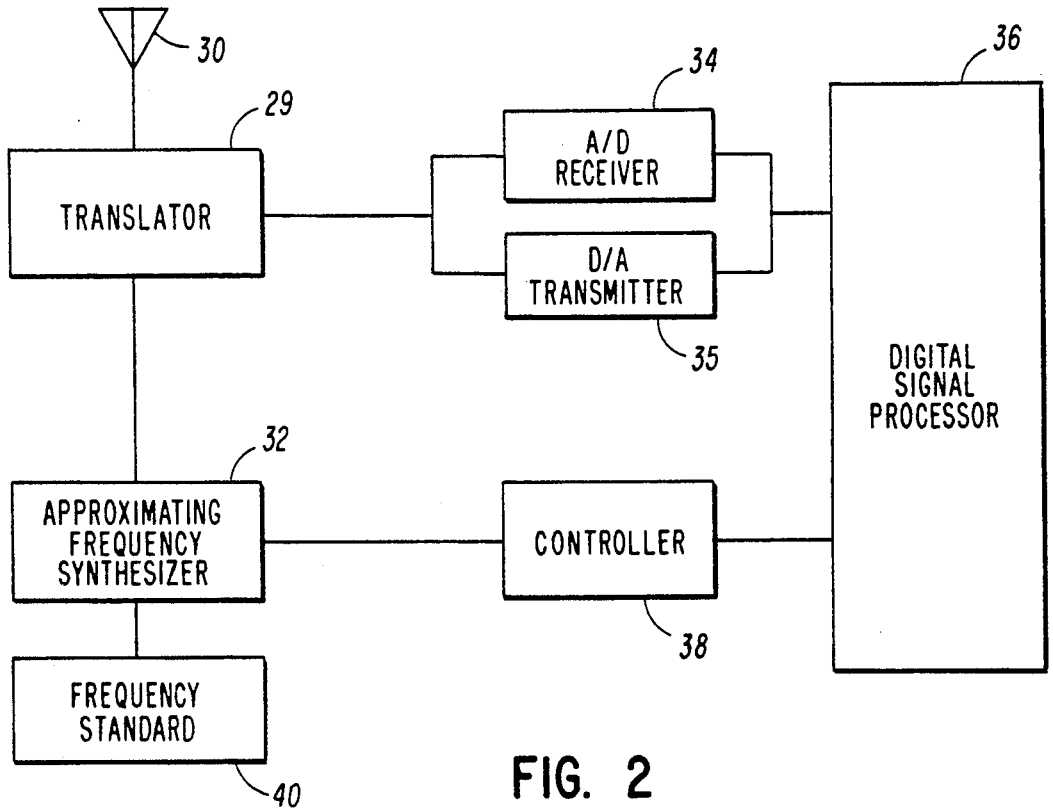
FIG. 2 is a block diagram of a communication receiver that incorporates the teachings of the present invention.

FIG. 2 illustrates a block diagram of a communication system incorporating the present invention. Antenna 30 is coupled to a translator 29. Translator 29 has a first connection to approximating frequency synthesizer 32, and a second connection to analog-to-digital converter 34 and to digital-to-analog converter 35. Converters 34 and 35 are coupled to digital signal processor unit 36. A controller, 38 is coupled to approximating frequency synthesizer 32 and DSP 36. Controller 38 allows a system user to select desired tuning frequencies. A frequency standard 40 may also be coupled to approximating frequency synthesizer 32 for accuracy purposes.

Figure 3:
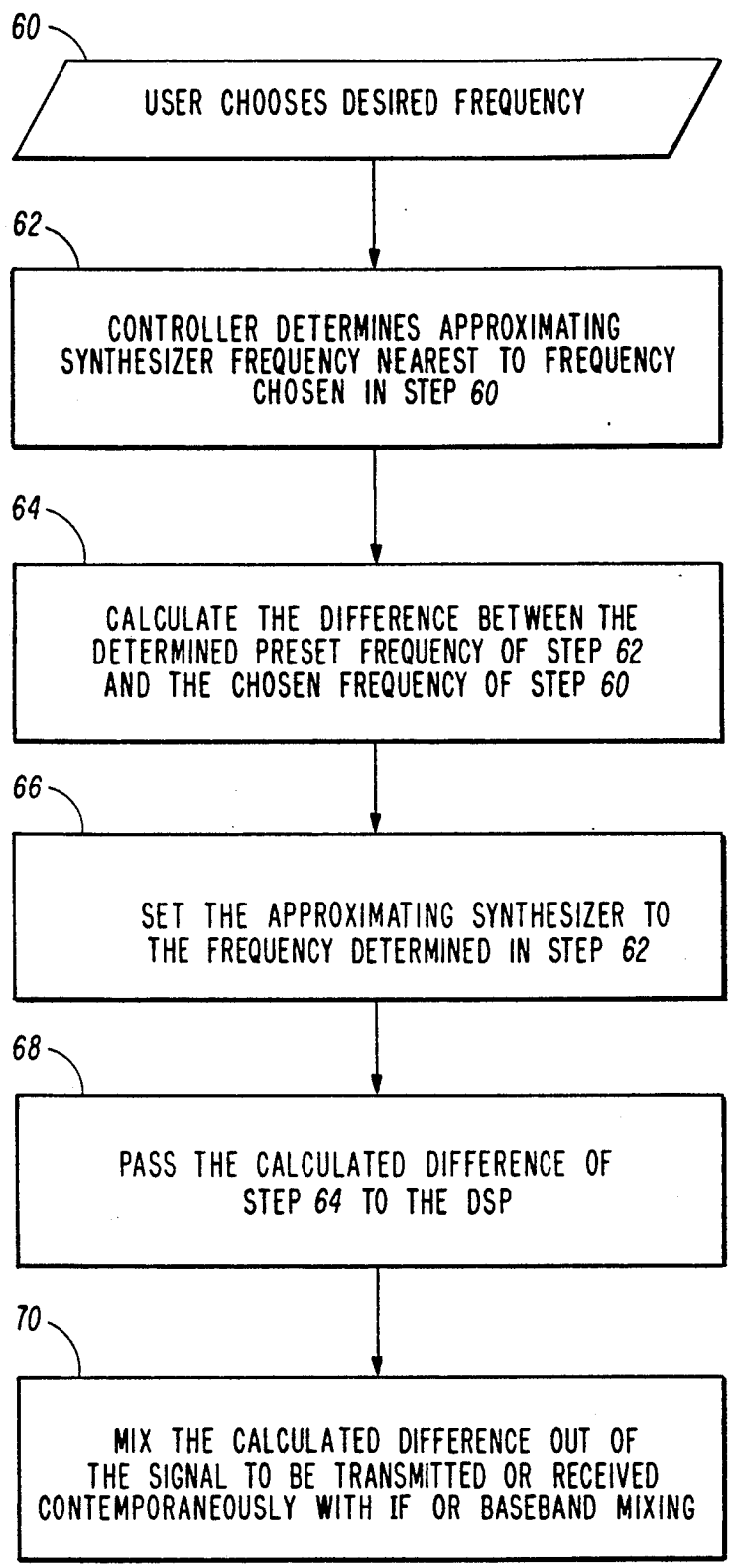
FIG. 3 is a flowchart representation of the present invention.

FIG. 3 illustrates the functionality of the system depicted in FIG. 2 in a flowchart diagram. The first step 60 requires the user to choose a frequency upon which to transmit or receive. The next step 62 requires the system controller to determine the closest frequency available on the approximating frequency synthesizer to the user chosen frequency. For step 64, the controller calculates the difference between the user selected frequency and the closest approximating frequency synthesizer available frequency and routes this information to the digital signal processor. In step 66 the controller sets the approximating frequency synthesizer to the frequency selected in step 62 and passes the calculated frequency difference on to the DSP, step 68. The DSP mixes the calculated difference of step 66 and the IF out of the received or to be transmitted signal, step 70.

Figure 4:
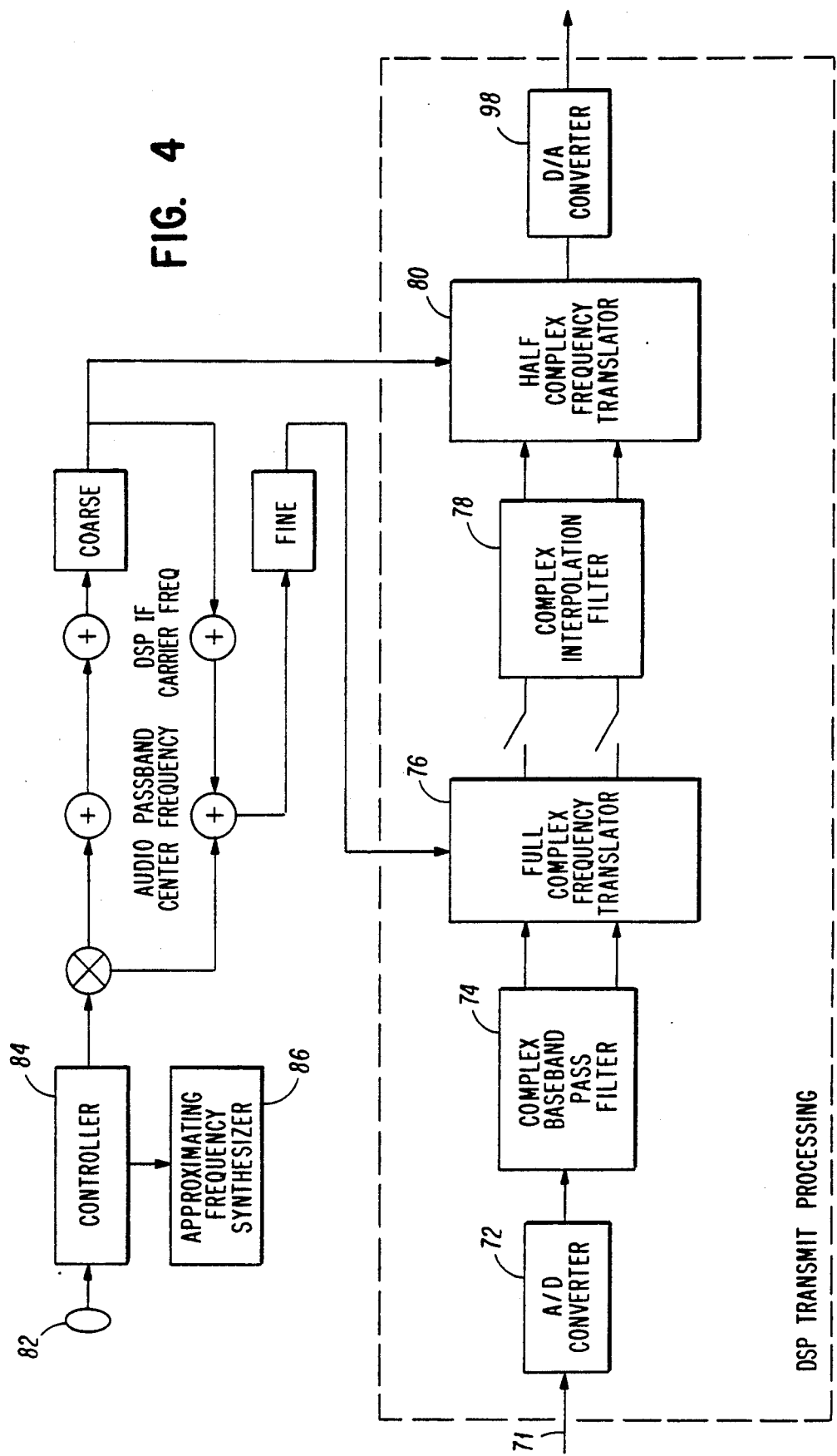
FIG. 4 is a block diagram of an alternate embodiment of the present invention showing separate steps for the coarse and fine frequency tuning steps.

FIG. 4 illustrates an alternate embodiment of the present invention incorporated into a transmitter device. It should be noted that the embodiment depicted in FIG. 4 contains circuit complexities not necessary in order to implement the fundamental teachings of the present application. Signal splitting into a coarse and fine element is not a requirement for implementing the process outlined in the flow-chart of FIG. 3.

In FIG. 4, audio input 71 is transformed to a digitized signal in analog-to-digital converter 72. The output of analog-to-digital converter 72 is coupled to complex bandpass filter 74. An intermediate frequency signal I and a complex baseband signal Q are the resultant output of BPF 74 and are coupled to full complex frequency translator 76. The output of device 76 is coupled to complex interpolation filter 78 which in turn is coupled to half complex frequency translator 80.

Independent of the above described signal processing in FIG. 4, a dial frequency 82 is chosen by a user and noted by a controller 84. Controller 84 determines and selects the approximating synthesizer frequency closest available value and calculates the difference in the user chosen and synthesizer selected frequency. The calculated frequency error is routed to the DSP which performs coarse and fine frequency quantization. The resultant fine frequency quantization is coupled to the full complex frequency translator 76. FCFT 76 has two outputs that are clocked signal inputs to complex interpolation filter 78. CIF 78 provides filtered output signals to half complex frequency translator 80. Additionally, coarse frequency quantization output is coupled to the half complex frequency translator 80. The output of the HCFT 80 is coupled to digital-to-analog converter 98 whose output serves as the DSP transmitted signal frequency.

It is thought that the apparatus and method of the present invention and many of its attendant advantages will be understood from the foregoing description, and it will be apparent that various changes may be made in the form, construction and arrangement of the parts and the steps thereof without departing from the spirit and scope of the invention, or sacrificing all their material advantages, the forms described herein being merely preferred embodiments thereof.

We claim:

1. A communication system apparatus for transmitting or receiving carrier signals and having appropriate antenna means comprising:
   frequency selection means selecting a desired frequency upon which to transmit or receive signals;
   an approximating frequency synthesizer having a plurality of predetermined frequencies;
   controller means coupled to the approximating frequency synthesizer that sets all approximating frequency to the predetermined frequency that is determined to be closest in value to the desired frequency and determines the different in the closest predetermined frequency and the desired frequency; and
   a digital signal processor, coupled to the controller means, that receives the difference in the desired frequency and the closest predetermined frequency of the approximating frequency synthesizer and adjusts for such difference during signal mixing.

2. The apparatus of claim 1, wherein the approximating frequency synthesizer is comprised of a synthesizer having two Phase Locked Loops.

3. The apparatus of claim 1, that operates within the frequency range of 2 to 88 MHz band.

4. The apparatus of claim 1, further comprising means for performing coarse and fine tuning in processing signals.

5. The apparatus of claim 1, further comprising frequency standard means.

6. The apparatus of claim 1, wherein the approximating frequency synthesizer is capable of producing a set of frequencies with 1 KHz error or less.

7. The apparatus of claim 2, wherein Phase Locked Loops are comprised of a plurality of programable divider components.

8. A method for performing high resolution frequency tuning in a communication system having a controller, an approximating synthesizer having plurality of predetermined frequencies and digital signal processing means comprised of the following steps:
   choosing a desired communication frequency;
   determining a predetermined frequency of the approximating synthesizer;
   calculating the difference between the predetermined frequency and the desired frequency;
   setting the approximating synthesizer to the predetermined frequency;
   routing the calculated difference of the desired frequency and the predetermined frequency to the digital signal processing means; and,
   mixing the calculated frequency difference out of the signal to be transmitted or received by the digital signal processing means.

9. The method of claim 8, further comprising separate steps for performing coarse and fine tuning in processing signals.

10. The method of claim 8, wherein the communication system operates within the frequency range of 2 to 88 MHz band.

11. The method of claim 8, wherein the approximating synthesizer is capable of producing a set of frequencies with 1 KHz error or less.

* * * * *